United States Patent [19]
Reichard

[11] Patent Number: 6,014,027
[45] Date of Patent: Jan. 11, 2000

[54] CURRENT AND VOLTAGE PROBE FOR MEASURING HARMONIC DISTORTION

[75] Inventor: Jeffrey A. Reichard, Menomonee Falls, Wis.

[73] Assignee: Metropolitan Industries, Inc., Romeoville, Ill.

[21] Appl. No.: 09/289,572

[22] Filed: Apr. 9, 1999

Related U.S. Application Data

[60] Division of application No. 08/538,374, Oct. 3, 1995, which is a continuation-in-part of application No. 08/138,419, Oct. 18, 1993, abandoned.

[51] Int. Cl.[7] .......................... G01R 23/20; G01R 29/12; G01R 31/02
[52] U.S. Cl. .......................... 324/623; 324/457; 324/620; 324/687; 324/72; 324/72.5
[58] Field of Search ..................................... 324/457, 620, 324/623, 687, 72, 72.5

[56] References Cited

U.S. PATENT DOCUMENTS

| | | | |
|---|---|---|---|
| 4,928,057 | 5/1990 | Williams | 324/72 |
| 5,072,187 | 12/1991 | Shilo | 324/623 |
| 5,293,113 | 3/1994 | Beha et al. | 324/72.5 |
| 5,365,164 | 11/1994 | Lowenstein et al. | 324/623 X |
| 5,886,528 | 3/1999 | Perry | 324/457 |

*Primary Examiner*—Glenn W. Brown
*Attorney, Agent, or Firm*—Rockey. Milnamow & Katz, Ltd.

[57] ABSTRACT

A non-contact probe provides information as to relative amplitudes of harmonics of a current or voltage waveform as well as total harmonic distortion. The probe includes a non-contact sensor with an amplifier coupled thereto. Output signals from the amplifier are digitized and analyzed in a programmed processor. Output from the processor provides a display of relative harmonic amplitudes as well as an indicator of total harmonic distortion.

7 Claims, 4 Drawing Sheets ns a side plan view of an instrument in accordance
CURRENT AND VOLTAGE PROBE FOR MEASURING HARMONIC DISTORTION This is a divisional application of copending U.S. patent application Ser. No. 08/538,374 filed Oct. 3, 1995, entitled CURRENT AND VOLTAGE PROBE FOR MEASURING HARMONIC DISTORTION, which is a continuation-in-part of U.S. patent application Ser. No. 08/138,419 filed Oct. 18, 1993, entitled CURRENT PROBE now abandoned.

FIELD OF THE INVENTION

The invention pertains to non-contact measurement instruments. More particularly, the invention pertains to instruments which detect current and voltage harmonic distortion using notched current transformers and capacitors respectively.

BACKGROUND OF THE INVENTION

Current measuring devices of a clamp-on or proximity-type are known. Such devices have historically been used to make current measurements in situations where it has been either impractical or undesirable for one reason or another, such as high voltage and/or high current applications, to use directly coupled current measuring instruments. Depending on the application, other parameters or total harmonic distortion (TBD) may in fact be more important than amplitude of the composite current waveform.

There continues to be a need for non-contact harmonic distortion measuring instruments which provide information about the ratio of the amplitudes of harmonics present in the current or voltage waveform being measured as well as distortion information. Preferably, such instruments would use a non-contact measuring technique in combination with analysis circuitry for providing real-time read outs of relative amplitude values of harmonics present in the signal being measured along with indicia of harmonic distortion.

SUMMARY OF THE INVENTION

A current probe for measuring harmonic distortion includes a housing a non-contact sensor and an amplifier coupled to said sensor both mounted within the housing, for providing an amplified representation of a detected current. A digital processor with an A/D converter is coupled to the amplifier's output for determining the presence of harmonics in the detected current as well as relative amplitude values thereof.

A graphical output device for displaying harmonic distortion in the detected current is coupled to a drive by the processor.

The current probe can include a magnetic current sensor. More particularly, a non-contact sensor in accordance with the present invention includes a magnetic core with a discontinuity such as a notch or a partial gap formed therein. The notch or gap makes it possible for a varying magnetic field produced by a varying current flowing in an adjacent conductor to induce a non-zero, varying, flux in the core.

A coil wound around the core can be used as a detector for the varying flux in the core. A current induced in the coil, due to the changing flux, provides an output signal which can be amplified by an amplifier which will have a voltage output.

The amplified current from the coil can be fed to a plurality of automatic ranging amplifiers. The amplifiers include a plurality of parallel amplifiers wherein each of the amplifiers in the plurality has a different gain parameter.

The digital processor includes analysis circuitry for the purpose of determining relative amplitude values of detected harmonics in the measured current. These relative amplitude values can then be displayed.

In an alternate embodiment, harmonic distortion of a voltage waveform in an adjacent conductor can be detected and displayed. The two embodiments can be combined in a single non-contact instrument.

The alternate embodiment incorporates first and second capacitors. A first capacitor is formed between an end of a housing for the instrument and the conductor carrying the voltage to be measured.

A second capacitor is formed between a second end of the housing, and a user holding the housing. The user presents an impedance to ground.

The detector voltage signal is processed by circuitry within the housing. Relative harmonic values and total harmonic distortion can be displayed.

Because both of the sensors are non-contact devices and since they are contained within the housing for the probe, the present probe is compact and convenient to use. Neither sensor needs to be attached to or to enclose the conductor of interest. Because the sensors are passive devices, battery life of the probe will be lengthened.

These and other aspects and attributes of the present invention will be discussed with reference to the following drawings and accompanying specification.

DETAILED DESCRIPTION OF THE PREFERRED EMBODIMENTS

Figure 1:
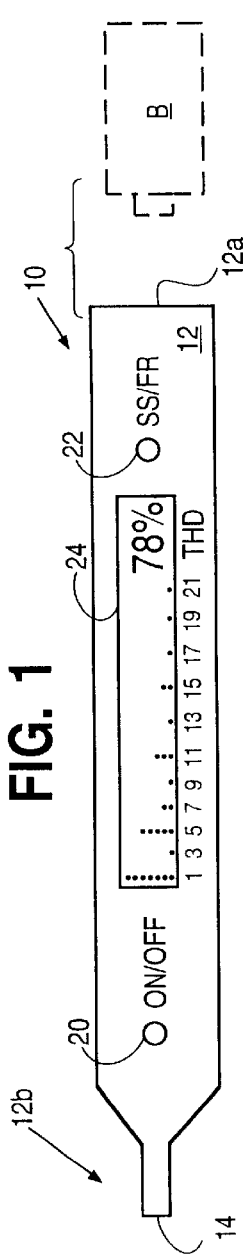
FIG. 1 is a side plan view of an instrument in accordance with the present invention.

While this invention is capable of being embodied in many different forms, there are shown in the drawing, and will be described herein in detail, specific embodiments thereof with the understanding that the present disclosure is to be considered as an exemplification of the principles of the invention and is not intended to limit the invention to the specific embodiments illustrated.

FIG. 1 illustrates a current probe 10 in accordance with the present invention. The probe 10 can be used to determine parameter values of a varying or an AC-type signal of interest. The probe 10 includes an elongated tubular housing 12 with a proximal end 12a and a distal end indicated generally at 12b.

Figure 2:
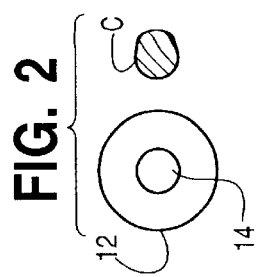
FIG. 2 is an end plan view of the instrument of FIG. 1.
Figure 3:
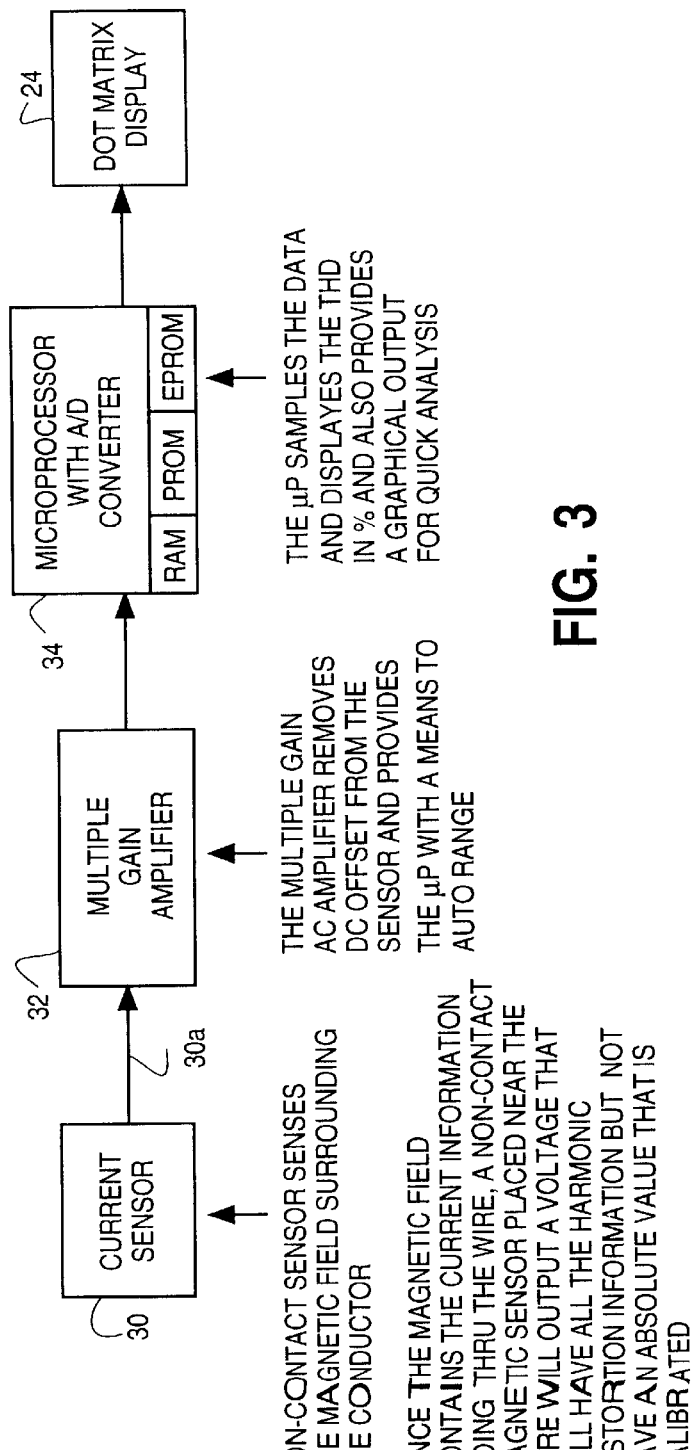
FIG. 3 is a block diagram of an electronic system for an instrument in accordance with the present invention.

The distal end 12b can be formed as an elongated cylindrical member with an exterior end surface 14, see FIG. 2. Carried on the housing 12 is an on/off switch 20 as well as a single sample/free running control switch 22.

Between the switches 20 and 22 is a display 24, which could be implemented as a liquid crystal display. The display 24 graphically illustrates relative amplitude values of harmonics present in the varying current being measured. In addition, total harmonic distortion (THD) is illustrated numerically as a percentage at the right end of the display 24.

Carried within the housing 12 is a non-contact, sensor 30 located at the cylindrical distal end 12b. The sensor 30 at the distal end 12b of the probe senses the magnetic field surrounding the conductor where a current measurement is desired.

Since the magnetic field is proportional to the current passing through the conductor, the non-contact sensor 30 generates an output current on a line 30a which includes necessary relative harmonic distortion information. Output from the sensor 30, an analogue current can in turn be amplified and processed further.

The sensor 30 is in turn coupled to one or more amplifiers 32. Multiple amplifiers are coupled in parallel to provide a plurality of outputs with different gains.

Outputs from the amplifier or amplifiers 32 are coupled to an analog input of a microprocessor 34. The analog input signal can be digitized by an A/D converter coupled to the processor 34. The processor 34 includes PROM, EEPROM as well as read-write, RAM, memory.

The microprocessor 34 includes control instructions, stored for example in PROM memory, for comparing the digitized outputs from the amplifier or amplifiers 32 to predetermined minimums and maximums for the purpose of selecting an amplified output which lies within an acceptable range. Read/write memory is provided for temporary parameter storage.

The microprocessor 34 is programmed to additionally carry out a Fourier Transform for purposes of analyzing the amplified input signal and for determining which harmonics are present and the relative amplitudes of those harmonics. Either a slow or a fist Fourier Transform can be used without departing from the spirit and scope of the present invention. The programmed transform instructions, stored in PROM memory for example, represent circuitry for determining relative harmonic distortion in a current flowing in an adjacent conductor C.

The output of the microprocessor 34 is in turn coupled to the display 24. As discussed previously, relative harmonic amplitude values can be illustrated graphically on the display 24. In addition, a numeric value of total harmonic distortion, as a percentage, can also be displayed.

The probe 10 can be powered off of a single 6 volt battery B (indicated in phantom) which could be inserted at the proximal end 12a. The measurable current range using a plurality of parallel AC amplifiers 32 is between 5 amps and 10,000 amps with automatic ranging.

Relative distortion values can be displayed in one percent steps, two percent steps, or five percent steps as desired. The graphic range illustrating relative distortion by harmonic can range from 0 to 105 percent in 15 percent steps or other increments as desired.

Measurements can be taken one at a time. Alternately, the measurements can be taken continuously with the graphs and the percent numeric value of total harmonic distortion continually being updated based on the setting of the selector switch 22.

Figure 4:
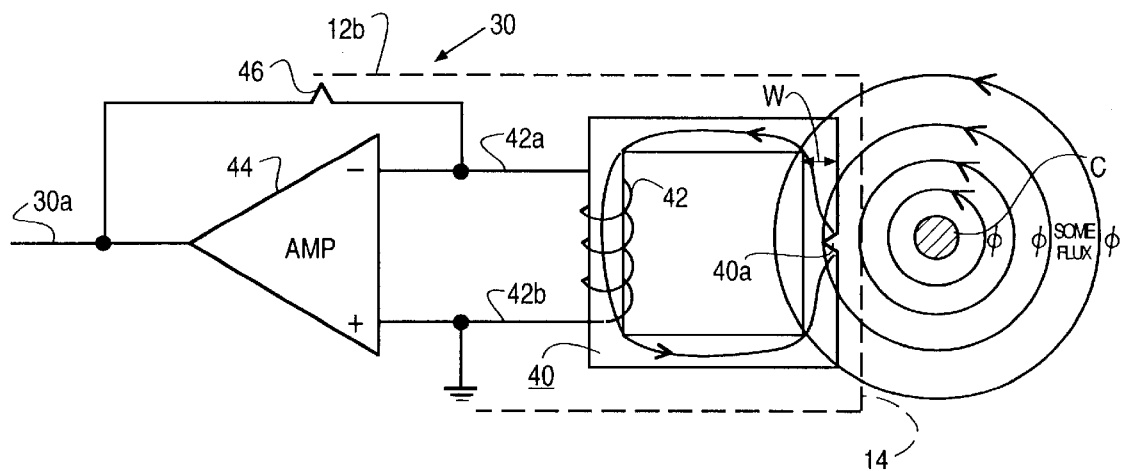
FIG. 4 is a schematic of a preferred non-contact sensor.

FIG. 4 is a schematic of a preferred form of non-contact sensor 30. The non-contact sensor 30 illustrated in FIG. 4 includes a passive magnetic core 40 which can be rectangular or circular and is formed as a closed, toroidal-like magnetic path for flux induced by an adjacent conductor C. The closed path has a substantially constant width W. The core 40, when formed is a one piece or unitary component wherein no portion of the core is moveable relative to any other portion of the core.

The magnetic core 40 carries a notch or partial gap 40a. The notch of gap 40a extends only partly into the width W of the core 40. The presence of the notch or gap 40a in turn makes it possible to detect magnetic fields associated with the conductor C without surrounding that conductor. Hence, the core 40 can be carried within the housing 12 improving reliability.

The magnetic field due to a current in the conductor C in turn, because of the notch 40a, induces a flux in the core 40. A coil 42 is wound around at least a portion of the magnetic core 40. The changing magnetic flux in the core 40 induces a voltage in the coil 42 which is proportional to the current in the conductor C.

Output leads 42a and 42b from the coil 42 can in turn be fed to an operational amplifier 44 which has preferably a high impedance FET input, such as an LF442 or 444-type amplifier. A feedback resister 46 is provided around amplifier 44.

An output voltage signal from the amplifier 44, on the line 30a corresponds to the current induced in the coil 42 by the flux induced in the magnetic core 40 from the conductor C which is adjacent thereto times the feedback resistor. The presence of the notch or partial gap 40a results in a passive sensor which continues to exhibit a high inductance and suitable low frequency response.

The coil 42, by way of example, could be formed with a thousand turns. The sensor 30 has a gain which can be controlled and adjusted by varying the size of a notch 40a and the number of turns in the coil 42.

The sensor 30 is particularly advantageous in that it has very low power requirements given the passive nature of the magnetic core 40. The sensor 30 exhibits no DC offset or drift with temperature and is very inexpensive. The size of the partial gap or notch 40a is such that the measurement accuracy achievable with magnetic core 40 is not affected by the presence of the partial gap or notch 40a.

It will be understood that the magnetic core 40 could be a type of magnetic core which is marketed as a current transformer. In a normal use of a current transformer, the sensed lead is located in the open region in the center of the magnetic core or transformer. Hence, the core or transformer surrounds the condition being measured. Merely placing a continuous core, such as a current transformer, adjacent to a conductor being measured will not induce a flux in the core.

The present sensor 30, which incorporates the magnetic core or transformer 40 and associated notch or partial gap 40a can be used to sense current in the conductor C without having to in some way place the conductor C into the opening in the center of the core or transformer 40. In accordance with the present invention, and the structure of the sensor 30 of FIG. 4, the conductor C need only be placed adjacent to the magnetic core or transformer 40 to effect a measurement. The conductor C is thus located outside of the magnetic core. The conductor C need not extend through the core 40.

The magnetic core 40 could be formed of wound layers of magnetic tape, in which case the notch or gap can be provided by cutting several layers of tape. Alternately, magnetic cores formed by other manufacturing techniques could also be used. A saw could be used to start the notch 40a.

Figure 5:
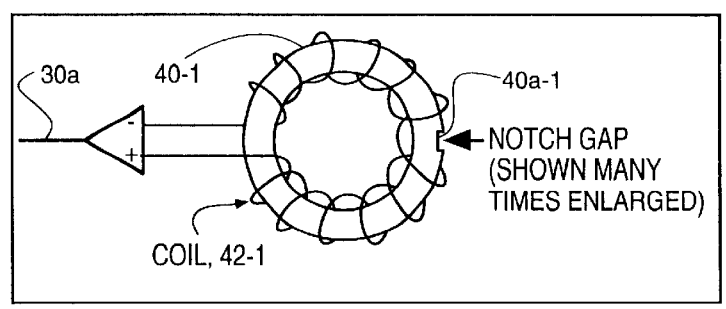
FIG. 5 is a schematic of an alternate current sensor in accordance with the present invention.

FIG. 5 illustrates an alternate embodiment of the sensor 30 which incorporates an annular core 40-1 with an associated notch 40a-1. Other shapes could also be used.

Figure 6:
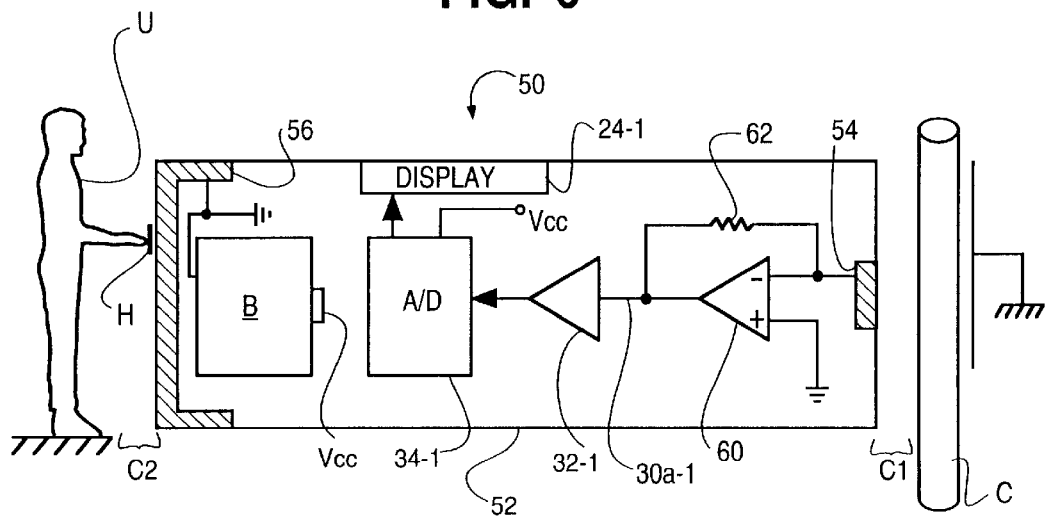
FIG. 6 is a schematic of a voltage probe in accordance with the present invention.

FIG. 6 illustrates a non-contact voltage probe 50 in accordance with the present invention. Illustrated separately, it will be understood that the voltage probe 50 could be integrated into and combined with the current probe 10 into a dual mode product in a single housing. The probe 50 can determine and display relative distortion of the voltage waveform on the conductor C.

The probe 50 includes a non-conductive housing 52 which carries first and second capacitor plates 54 and 56 therein. The plate 54 in a preferred embodiment has an area on the order of ½ inches square with dimensions, for example, on the order of ½" by 1". Plate 56 has an area on the order of 2 inches square.

Figure 7:
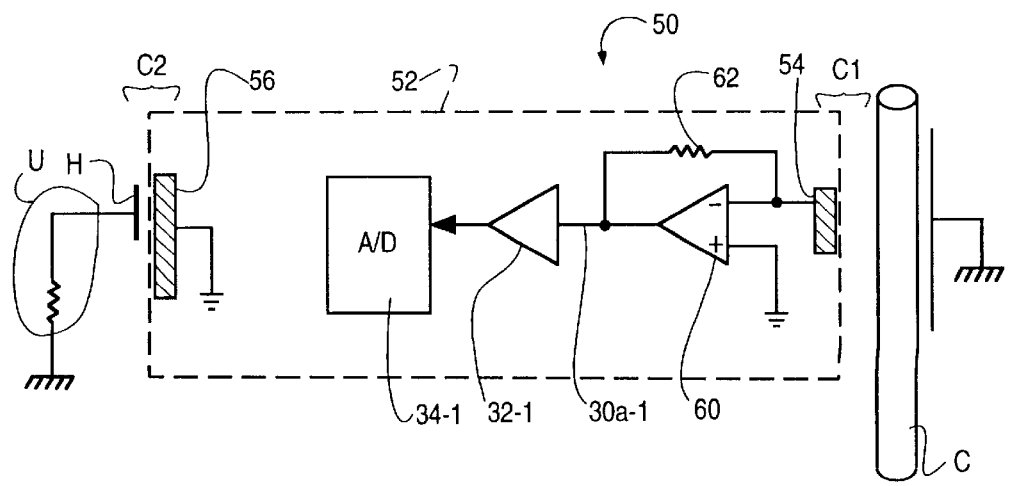
FIG. 7 is another schematic of the voltage probe of FIG. 6.

Both of the capacitor plates 54, 56 are positioned within the non-conducting housing 52. As illustrated in FIGS. 6 and 7, first capacitor C1, associated with plate 54 and second capacitor C2, associated with plate 56, are formed between a conductor C whose voltage is to be detected and ground when a grounded user U places the probe 50 in proximity to the conductor C to make a voltage measurement.

In the configuration illustrated in FIGS. 6 and 7, the capacitor plate 56, associated with capacitor C2, is coupled to the common for the circuitry within the housing 52. The user U provides an impedance to ground.

It will be understood that the hand H of the user U holding the non-conducting case 52 forms the second plate of the capacitor C2 and that the body of the user U is in effect a resistor to earth ground thereby completing the circuit. The second plate of the capacitor C1 is formed by the conductor C for which the voltage distortion is to be measured.

Coupled to the capacitor plate 54 is a high impedance operational amplifier 60, with an FET-type input, such as an LF442 or 444 operational amplifier. A feedback resistor 62 closes the loop around the amplifier 60.

Output from the amplifier 60, on a line 30a-1 can be on the order of plus or minus 5 volts peak-to-peak and proportional to a varying voltage on the conductor C. The line 30a-1 can be in turn coupled to multiple gain AC amplifier 32-1, microprocessor 34-1, and display 24-1 for purposes of providing an indication of the voltage distortion on the conductor C with respect to earth ground.

It will be understood that the probe 50 provides an indication of relative voltage distortion present in the voltage waveform in the conductor C. Relative harmonic values as well as total harmonic distortion can be displayed, as on display 24-1 for the user U.

Figure 8:
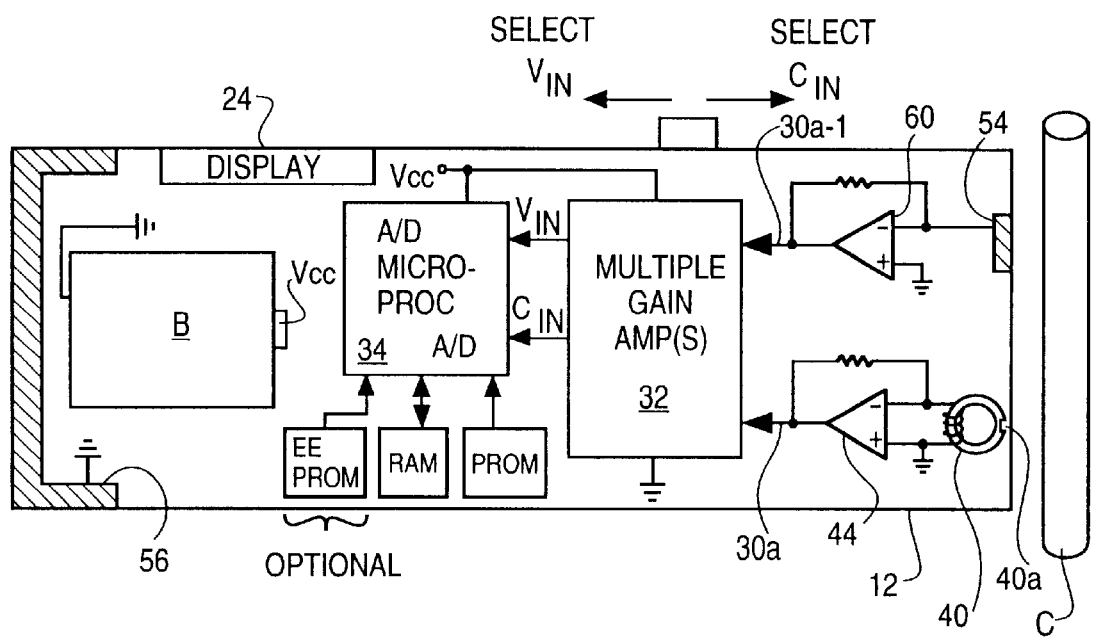
FIG. 8 is a block diagram of a combined voltage and current probe.

The current probe 10, incorporating the transducer 30, can be combined with the voltage probe 50 into a single housing as one instrument as illustrated in FIG. 8. The microprocessor 34 can be programmed to determine relative harmonic distortion for the current and the voltage of an adjacent conductor, such as the conductor C.

Current and voltage relative harmonic values and total harmonic distortion can be displayed sequentially on the dot matrix display 24 or simultaneously on two displays. Liquid crystal displays could also be used.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. A non-contact probe for measuring harmonic distortion of a current in a conductor comprising:

a rigid housing with an elongated dimension;

a passive, non-contact voltage sensor carried within said housing wherein said sensor includes first and second capacitor plates for detecting a voltage difference therebetween, wherein the first and second capacitor plates are spaced apart so as to enable the first capacitor plate to be brought within proximity of an adjacent conductor, wherein said sensor senses a voltage present in said adjacent conductor when the first capacitor plate is brought within proximity of the conductor without contacting the conductor;

a processor coupled to the first capacitor plate of said sensor for determining the presence of harmonics in the detected voltage as well as relative amplitude values thereof; and an output device coupled to the processor for displaying harmonic distortion in the detected voltage wherein said output device is positioned on said housing.

2. A probe as in claim 1 wherein a first capacitor is formed between said first plate and the conductor when said first plate is positioned adjacent to the conductor, and a second capacitor is formed between said second plate and a resistive impedance to ground.

3. A probe as in claim 2 wherein said resistive impedance to ground includes a grounded user supporting said housing.

4. A probe as in claim 1 which includes an amplifier coupled to said sensor for providing an amplified representation of a detected voltage.

5. A probe as in claim 4 wherein said amplifier includes a plurality of parallel amplifiers wherein each of the amplifiers in the plurality has a different gain parameter.

6. A probe as in claim 1 wherein said output device includes a graphical display for the purpose of displaying relative amplitude values of detected harmonics in the measured voltage.

7. A probe as in claim 1 which includes an A/D converter coupled to said processor for receiving the detected voltage.

* * * * *